United States Patent [19]
Lee

[11] Patent Number: 6,005,382
[45] Date of Patent: Dec. 21, 1999

[54] OUTPUT SIGNAL MEASURING APPARATUS FOR MULTIPLE FREQUENCY OSCILLATOR AND OUTPUT SIGNAL MEASURING AND CORRECTING METHODS THEREOF

[75] Inventor: Sang-Jin Lee, Kyonggi-do, Rep. of Korea

[73] Assignee: Hyundai Electronics Ind. Co., Ltd., Rep. of Korea

[21] Appl. No.: 09/009,996

[22] Filed: Jan. 21, 1998

[30] Foreign Application Priority Data

Feb. 6, 1997 [KR]  Rep. of Korea ......................... 97-3720

[51] Int. Cl.⁶ .................................................. G01R 23/02
[52] U.S. Cl. ...................................... 324/76.48; 324/76.62
[58] Field of Search ............................... 324/76.48, 76.39, 324/601, 76.59, 616, 76.62; 455/67.1, 67.2, 67.3, 226.1

[56] References Cited

U.S. PATENT DOCUMENTS

| | | | |
|---|---|---|---|
| 3,895,293 | 7/1975 | Munz | 324/78 Z |
| 4,374,358 | 2/1983 | Hirose | 324/78 D |
| 5,423,070 | 6/1995 | Vaisanen | 455/67.1 |

*Primary Examiner*—Josie Ballato
*Assistant Examiner*—Vincent Q. Nguyen
*Attorney, Agent, or Firm*—Lawrence G. Kurland, Esq.; Bryan Cave LLP

[57] ABSTRACT

An output signal measuring apparatus for a multiple frequency oscillator device and output signal measuring and correcting methods therefor which are capable of accurately and rapidly measuring a signal from each terminal of a multiple frequency oscillator device and minimizing a measuring and correcting time by automatically performing a correction required for a measurement. The apparatus is capable of measuring each terminal of a multiple frequency oscillator based on a switching circuit in accordance with control of a computer by integrating a plurality of measuring equipment into one system for satisfying a corresponding measuring item with respect to all terminals of the multiple frequency oscillator, automatically correcting with respect to each such terminal, and accurately and rapidly measuring each terminal of the multiple frequency oscillator by using a predetermined time and manpower, thus implementing mass production.

2 Claims, 3 Drawing Sheets

OUTPUT SIGNAL MEASURING APPARATUS FOR MULTIPLE FREQUENCY OSCILLATOR AND OUTPUT SIGNAL MEASURING AND CORRECTING METHODS THEREOF

BACKGROUND OF THE INVENTION

1. Field of the Invention

The present invention relates to an output signal measuring apparatus for a multiple frequency oscillator and output signal measuring and correcting methods therefor, and in particular, to an improved output signal measuring apparatus for a multiple frequency oscillator and output signals measuring and correcting methods therefor which are capable of accurately and rapidly measuring a signal from each terminal of a multiple frequency oscillator while minimizing the measuring and correcting time by automatically performing a correction which is needed to the measurement.

2. Description of the Prior Art

Generally, the multiple frequency oscillator which is used in a satellite system processes various kinds of frequencies due to the changes in the frequency use and communication allocation method. Therefore, when measuring the output frequencies and characteristics of all terminals of the multiple frequency oscillator for increasing the reliability of the satellite system, the measuring equipment which is needed for measuring each item must be manually connected. Therefore, considerable measuring time is required due to complicated measuring processes, and it is difficult to perform a measurement within a predetermined time.

In particular, in the case of a conventional RF/microwave, even when devices which have the identical design specification are fabricated based on the frequency characteristic, a big difference still occurs in their characteristics.

Therefore, when measuring all devices, since there are many different measuring items with respect to the device such as a frequency oscillator, considerable measuring time and a high measuring cost are required. Therefore, mass production is not achieved.

Furthermore, recently, as the personal communication system has advanced in the art, and the mass production of a Low Earth Orbit (LEO) for accomplishing this is becoming a reality, mass production of RF/microwave devices and an advanced measuring technique are desperately needed.

SUMMARY OF THE INVENTION

Accordingly, it is an object of the present invention to provide an improved output signal measuring apparatus for a multiple frequency oscillator and output signal measuring and correcting methods therefor which overcome the aforementioned problems encountered in the prior art.

It is another object of the present invention to provide an improved output signal measuring apparatus for a multiple frequency oscillator and output signal measuring and correcting methods therefor which are capable of accurately and rapidly measuring a signal from each terminal of a multiple frequency oscillator while minimizing the measuring and correcting time by automatically performing a correction which is needed the measurement.

It is still another object of the present invention to provide an improved output signal measuring apparatus for a multiple frequency oscillator and output signal measuring and correcting methods therefor which are capable of measuring each terminal of a multiple frequency oscillator based on a switching circuit in accordance with control of a computer by integrating a plurality of measuring equipment into one system for satisfying a corresponding measuring item with respect to all terminals of a multiple frequency oscillator, automatically correcting with respect to each terminal, and accurately and rapidly measuring each terminal of the multiple frequency oscillator by using a predetermined time and manpower, thus implementing mass production.

In order to achieve the above objects, there is provided an output signal measuring apparatus for a multiple frequency oscillator which includes a multiple frequency oscillator for outputting a frequency signal for satellite communication, a first switching unit for switching a frequency signal outputted through a cable connected with the frequency oscillator, a power dividing unit for receiving a frequency signal of a corresponding terminal of the frequency oscillator switched by the first switching unit and dividing the power, a spectrum analyzer for analyzing the spectrum of a frequency signal of the power divided by the power dividing unit, a coupler for dividing a frequency signal of the power divided by the power dividing unit, a second switching unit for selectively switching a frequency signal from the coupler or a reference signal for a correction outputted from a CW generator, a frequency counter for counting a frequency from the frequency oscillator outputted from the coupler, a power measuring unit for measuring the power of a frequency signal selected by the second switching unit or the reference signal for a correction, a computer for storing the values measured by the spectrum analyzer, the frequency counter and the power measuring unit, receiving a measuring loss and phase delay information of a signal by the cable, correcting the values measured by the spectrum analyzer, the frequency counter and the power measuring unit, and outputting a switching control signal to the switch matrix, and a CW generation unit for generating a reference signal for correcting the values measured by the spectrum analyzer, the frequency counter and the power measuring unit.

In order to achieve the above objects, there is provided an output signal measuring and correcting method for a multiple frequency oscillator means which includes the steps of first outputting a frequency signal from a first terminal of the frequency oscillator means to a power divider means in accordance with a switching control signal when measuring all terminals of the frequency oscillator means without correcting the same, second dividing the power with respect to a frequency signal of the first terminal of the frequency oscillator means using the power dividing means and outputting a frequency signal to a spectrum analyzer means, a frequency counter means and a power measuring means, third analyzing a spectrum of the frequency signal of the first terminal of the frequency oscillator means using the spectrum analyzer means, measuring a phase noise and a spurious output, measuring a frequency of the signal using a frequency counter means and a power of the frequency signal using the power measuring means, and writing the measured values into a computer means, fourth selecting a second terminal of the frequency oscillator means in accordance with the switching control signal, performing the second and third steps, and measuring frequency signals from all terminals of the frequency oscillator means by the items, fifth measuring a frequency signal of a corresponding terminal using measuring equipment and writing the measured signal into the computer means when selecting a terminal of the frequency oscillator means to be measured in the first step, sixth connecting a CW generator means to a terminal of the frequency oscillator means to be measured based on the switching operation when correcting in the first step, seventh measuring a cable loss with respect to a cable I connected with each port of the frequency oscillator means and writing the loss into the computer means, eighth connecting the CW generation means and the power measuring means, measuring a power value of a reference signal from the CW generator means and writing the value into the computer means, ninth writing the power of the CW generator means read by the spectrum analyzer means into the means computer when the paths are the spectrum analyzer means and the power measuring means and computing the equipment loss of the power measuring means into the computer means, a tenth computing the loss of the corresponding measuring equipment and computing the loss into the computer means when both the spectrum analyzer means and the power measuring means are not corrected, eleventh continuously measuring other terminals of the frequency oscillator means, connecting the terminal of the CW generator means to the next terminal of a cable II, computing the losses of the spectrum analyzer means and the power measuring means, and writing the losses into the computer means, and twelfth computing the loss measured in the seventh step through eleventh step, a cable loss, and a reference signal generated by the CW generation means, and correcting an error with respect to the measuring value and the measuring value of each terminal of the frequency oscillator means.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The output signal measuring apparatus for a multiple frequency oscillator and output signal measuring and correcting methods therefor according to the present invention will now be explained in detail with reference to the accompanying drawings.

Figure 1:
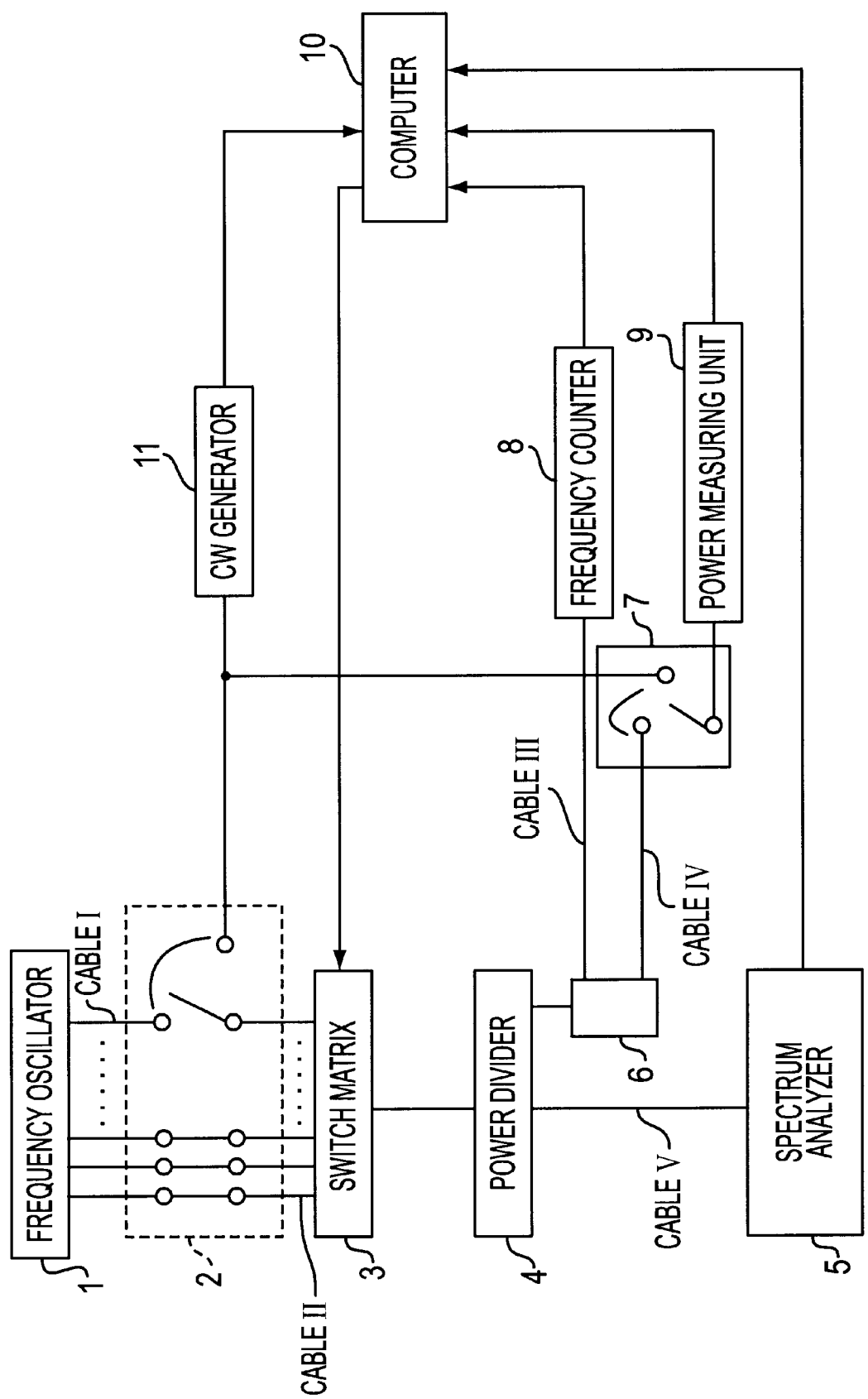
FIG. 1 is block diagram illustrating an output signal measuring apparatus for a multiple frequency oscillator according to the present invention.

First, FIG. 1 illustrates an output signal measuring apparatus for a multiple frequency oscillator according to the present invention. As shown therein, the output signal measuring apparatus includes a multiple frequency oscillator 1 for outputting frequency signals for satellite communication through 32 ports, a first switching unit 2 for selectively outputting an output signal from the multiple frequency oscillator 1, a switch matrix 3 for switching one signal among the frequency signals outputted through the cables I and II connected with each port of the frequency oscillator 1, a power divider 4 for receiving the frequency signal of a corresponding terminal of the frequency oscillator 1 switched by the switch matrix 3 and dividing the power, a spectrum analyzer 5 for analyzing the spectrum of the frequency signal the power of which is divided by the power divider 4, a coupler 6 for dividing the frequency signal the power of which is divided by the power divider 4, a second switching unit 7 for switching a frequency signal of the frequency oscillator 1 outputted from the coupler 6 or a reference signal for a correction, a frequency counter 8 for measuring the frequency from the frequency oscillator 1 outputted from the coupler 6 and counting the same, a power meter 9 for selectively measuring a frequency signal of the frequency oscillator outputted through the coupler 6 which is selected by the second switching unit 7 or the power of a reference signal for the correction, a computer 10 for storing the values measured by the spectrum analyzer 4, the frequency counter 8 and the power measuring unit 9, outputting a switching control signal of the switch matrix 3, receiving the measured loss of the measuring equipment such as the spectrum analyzer 5, the frequency counter 8 and the power measuring unit 9 and the phase delay information of the signals based on the cables I, II, III, IV and V, and correcting the values measured by the spectrum analyzer 5, the frequency counter 8, and the power measuring unit 9, and an external continuous wave (CW) generator 11 for generating a reference signal for correcting the values measured by the spectrum analyzer 5, the frequency counter 8 and the power measuring unit 9.

With the above constituted output signal measuring apparatus of the multiple frequency oscillator 1 according to the present invention, the characteristic of each element should be accurately measured based on the measuring accuracy of the measuring equipment. In the case of the multiple frequency oscillator 1, various items such as the accuracy of the frequency, the power of the frequency, and the spurious level are measured.

Figure 2A:
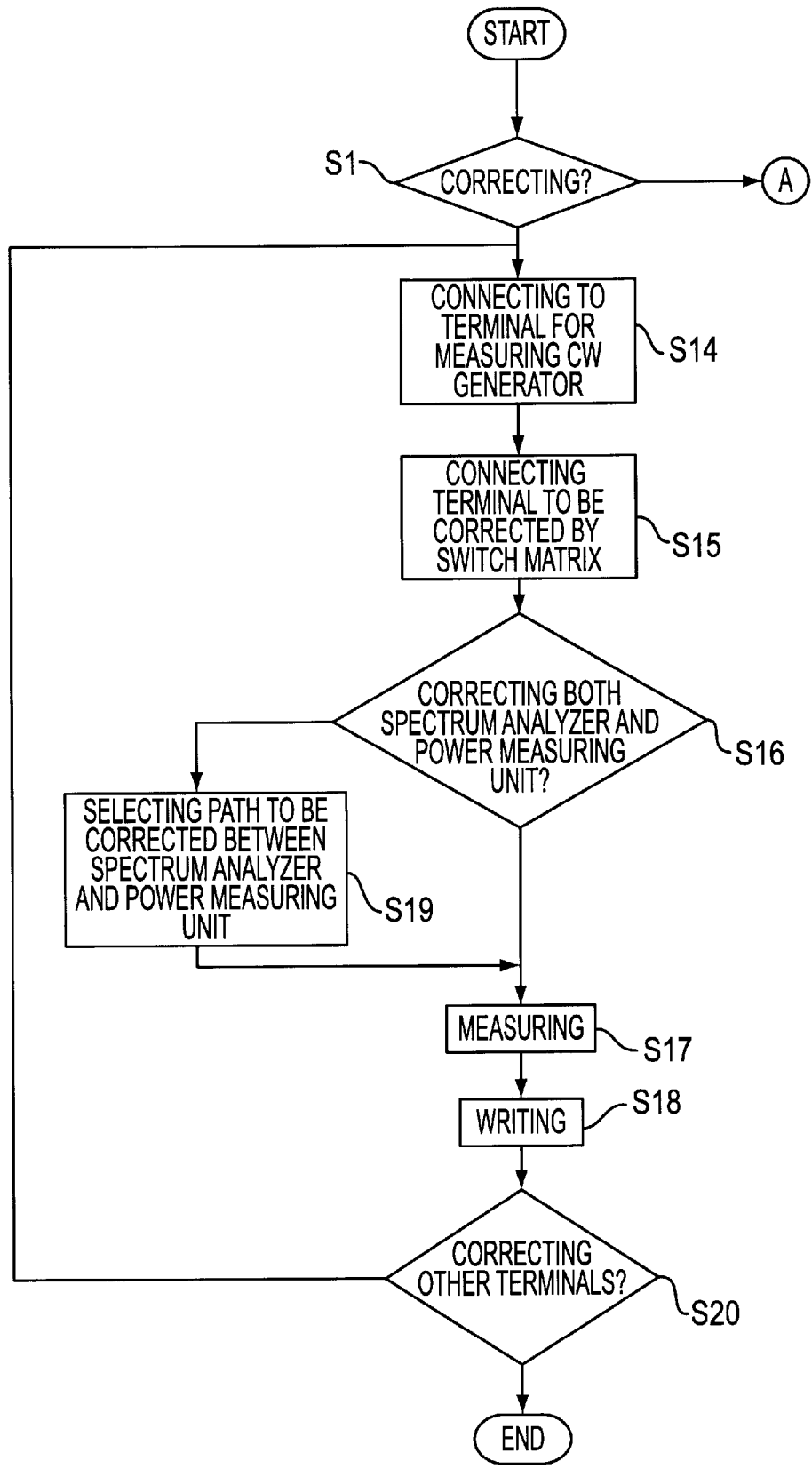
FIGS. 2A and 2B are flow charts illustrating an output signal measuring and correcting method for a multiple frequency oscillator according to the present invention.
Figure 2B:
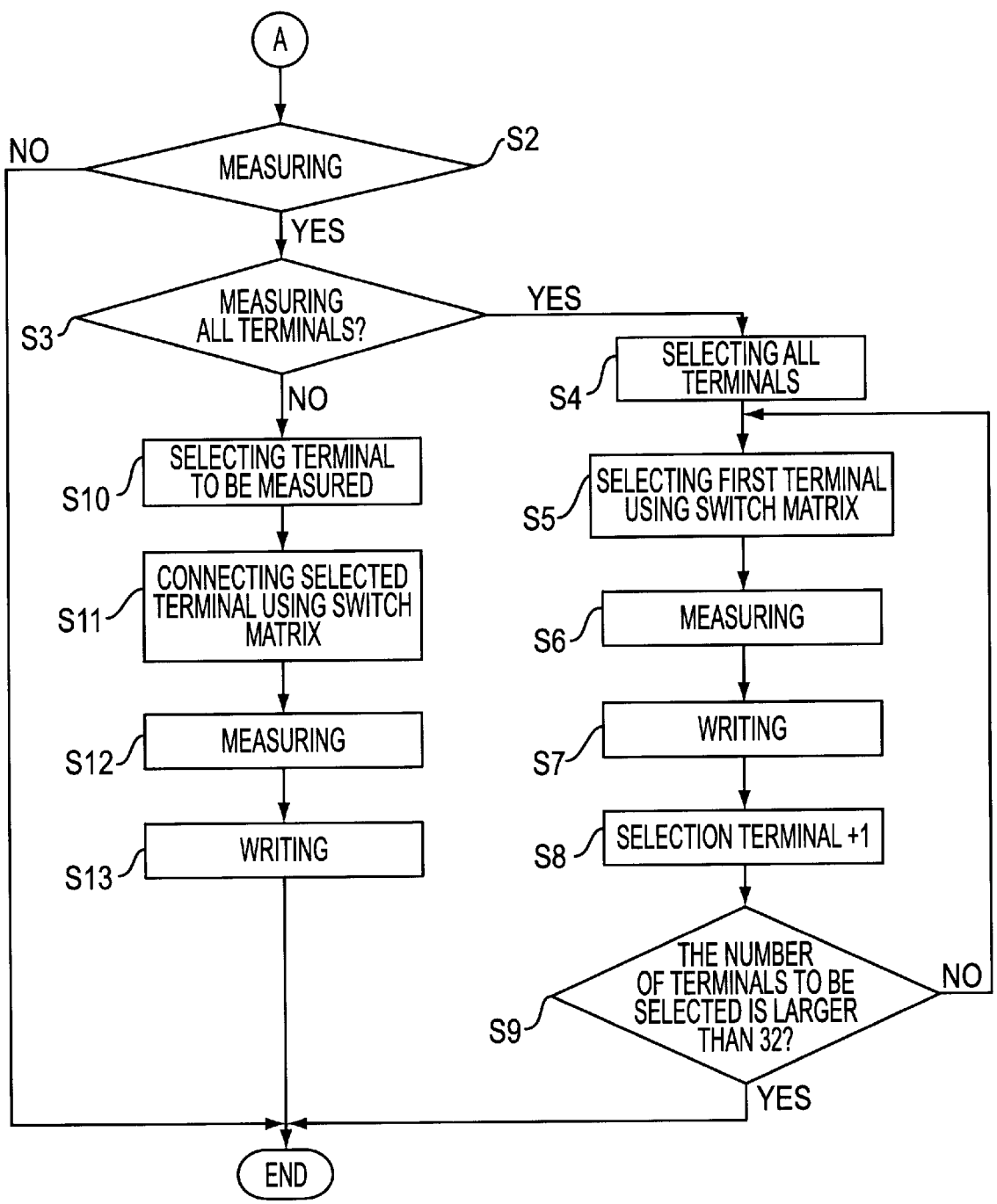

The signals from each terminal of the multiple frequency oscillator 1 according to the present invention are measured by the above items. The method for correcting the measuring values will be explained with reference to FIGS. 2A and 2B.

First, it is judged whether each output signal from the frequency oscillator 1 is corrected using predetermined measuring equipment in Step S1. If as a result of this judgement, a correction is not needed, it is then judged whether 32 terminals of the frequency oscillator 1 are measured in Step S2.

As a result of the judgement above, if all the terminals are needed to be measured in Step S3, the switch matrix 3 turns on the first terminal of the first switching unit 2 in accordance with a switching control signal from the computer 10 so that the frequency signal from the first terminal of the frequency oscillator 1 is outputted to the power divider 4 in Steps S4 and S5.

Therefore, the power divider 4 divides the power with respect to the frequency signal from the first terminal of the frequency oscillator 1 and outputs to the spectrum analyzer 5 through the cable V, and the power divider 4 divides the power through the coupler 6 and outputs to the frequency counter 8 and the power measuring unit 9, respectively.

After that, the spectrum analyzer 5 analyzes the spectrum of the frequency signal from the first terminal of the frequency oscillator 1 and measures the phase noise and spurious output and the frequency using the frequency counter 8, and the power measuring unit 9 measures the power of the frequency signal and writes the measured values into the computer 10 in Steps S6 and S7.

At this time, it is possible to measure a corresponding parameter value using predetermined measuring equipment without using all measuring equipment such as the spectrum analyzer 5, the frequency counter 8, and the power measuring unit 9.

The computer 10 selects the second terminal of the frequency oscillator by controlling the switching terminal of the switch matrix 3 in Step S8, and the parameter value is measured using predetermined measuring equipment in accordance with the frequency signal of the second terminal in Step S9.

Namely, step S8 is repeatedly performed, and the parameter values are measured by the measuring items with respect to 32 terminals of the frequency oscillator 1.

However, when all terminals are not measured in Step S3, only the terminals to be measured are selected, and the selected terminals are connected using the switch matrix 3, and a corresponding parameter value is measured and written into the computer in Steps S10 through S13.

At this time, there are many errors in the values measured by the measuring equipment due to the measuring loss of the measuring equipment, the phase delay based on the cable, etc.

Therefore, in order to compute more accurate measuring values, the correction step with respect to the measuring value should be performed.

Therefore, in the present invention, when correcting in Step S1, the CW generator 11 which generates a reference signal for measuring is connected with a corresponding terminal of the frequency oscillator 1 to be corrected by the switching operations of the first switching unit 2 and the switch matrix 3 in Steps S14 and S15.

Namely, the CW generator 11 is connected with the first terminal of the cable II.

At this time, the cable loss with respect to the cable I connecting 32 ports of the frequency oscillator 1 are corrected using a network analyzer, and a result of the correction is written into the computer 10.

In addition, when the output signal from the CW generator 11 is connected with the power measuring unit 9 by the switching operation of the second switching unit 7, the power measuring unit 9 accurately corrects the power value of the reference signal from the CW generator 11 and writes into the computer 10.

If the paths to be corrected are the spectrum analyzer 5 and the power measuring unit 9, the loss read from the spectrum analyzer 5 is added to the power of the CW generator 11 and is written into the computer. Thereafter, the equipment loss of the power measuring unit 9 is computed and written into the computer in Steps S16 through S18.

However, when both the spectrum analyzer 5 and power measuring unit 9 are not corrected, a path to be corrected is selected between the spectrum analyzer 5 and the power measuring unit 9 and is written into the computer 10 in Step S19.

Next, when continuously measuring other terminals, the terminal of the CW generator 11 is connected to the next terminal of the cable II, and then the loss of the spectrum analyzer 5 and the power measuring unit 9 are computed, and a result of the computation is written into the computer 10, and then the other terminals are corrected in Step S20.

When the above-described steps are performed, the computer 10 computes the loss which is generated by the reference signal from the CW generator 11 and the losses generated by various measuring equipment are computed, and the errors with respect to the measuring value is corrected, thus accurately computing the measured values.

Therefore, in the present invention, when changing the cable I or cable II due to the selection between the measuring path and terminal when correcting, the correction is not performed with respect to all terminals. Namely, only the changed portions are corrected, thus reducing the correction time.

As described above, in the present invention, it is possible to accurately, rapidly and easily correct the devices which are manufactured by mass production based on the measured items, so that it is possible to prevent equipment and manpower loss.

In addition, the measuring operation is performed with respect to only the changed cable terminal among (32×2) cables of the cable I or II, so that it is possible to reduce the measuring time and enhance the accuracy of the measurements.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An output signal measuring apparatus for a multiple frequency oscillator, comprising:

multiple frequency oscillating means for outputting a frequency signal for satellite communication;

first switching means connected to an output of said multiple frequency oscillating means for switching said frequency signal outputted from said multiple frequency oscillating means;

power dividing means connected to said first switching means for receiving said frequency signal from a corresponding terminal of said frequency oscillating means switched by said first switching means and dividing the power;

spectrum analyzer means connected to said power dividing means for analyzing a spectrum of said frequency signal of the power divided by said power dividing means;

a coupler means connected to said power dividing means for dividing said frequency signal of the power divided by said power dividing means;

CW generation means for generating a reference correction signal, second switching means connected to said CW generation means and said coupler means for selectively switching between said frequency signal from said coupler means and said reference correction signal outputted from said CW generation means;

frequency counter means connected to said coupler means for counting said frequency from said frequency oscillating means outputted from said coupler means;

power measuring means connected to said second switching means for measuring the power of said frequency signal selected by said second switching means or said reference correction signal; and computer means connected to said frequency counter means, said power measuring means, said spectrum analyzer means, said CW generation means, and said first switching means for storing the values measured by said spectrum analyzer means, said frequency counter means and said power measuring means, receiving measuring loss and phase delay information for said signal, correcting the values measured by said spectrum analyzer means, said frequency counter means and said power measuring means, and outputting a switching control signal to said first switching means;

said CW generation means generating said reference signal for correcting the values measured by said spectrum analyzer means, said frequency counter means and said power measuring means.

2. An output signal measuring and correcting method for a multiple frequency oscillator means wherein an output signal from the multiple frequency oscillator means is measured and corrected, said method comprising the steps of:

first, outputting a frequency signal from one of a plurality of terminals of the multiple frequency oscillator means to a power dividing means in accordance with a switching control signal when measuring all of said plurality of terminals of the frequency oscillator means without correcting the measurements;

second, dividing the power with respect to said frequency signal from said one terminal of the frequency oscillator means with the power dividing means and outputting said power divided frequency signal to a spectrum analyzer, a frequency counter and a power measuring means;

third, analyzing a spectrum of said power divided frequency signal from said one terminal of the frequency oscillator means with the spectrum analyzer, measuring a phase noise and a spurious output, measuring the frequency of the signal using the frequency counter and the power of the frequency signal using the power measuring means, and writing the measured values into a computer means;

fourth, selecting another terminal of the plurality of terminals of the frequency oscillating means in accordance with the switching control signal, performing the second and third steps, and measuring frequency signals from all of said plurality of terminals of the frequency oscillating means by the items;

fifth, measuring a frequency signal of a corresponding terminal using measuring equipment and writing the measured signal into the computer means when selecting a terminal of said plurality of terminals of the frequency oscillating means to be measured in the first step;

sixth, connecting a CW generation means to a terminal of the frequency oscillator means to be measured based on the switching operation when correcting in the first step;

seventh, measuring a cable loss with respect to a cable connected with each port of the frequency oscillator means and writing the loss into the computer means;

eighth, connecting the CW generation means and the power measuring means, measuring a power value of a reference signal from the CW generation means and writing the value into the computer means;

ninth, writing the power of the CW generation means read by the spectrum analyzer into the computer means when the paths comprise the spectrum analyzer and the power measuring means and computing the equipment loss of the power measuring means into the computer means;

tenth, computing the loss of the corresponding measuring equipment and computing the loss into the computer means when both the spectrum analyzer and the power measuring means are not corrected;

eleventh, measuring continuously other terminals of said plurality of terminals of the frequency oscillating means, connecting the terminal of the CW generation means to the next terminal of a cable II, computing the losses of the spectrum analyzer and the power measuring means, and writing the losses into the computer means; and twelfth, computing the loss measured in the seventh step through eleventh step, a cable loss, and a reference signal generated by the CW generation means, and correcting an error with respect to the measuring value and the measuring value of each terminal of said plurality of terminals of the frequency oscillator means.

* * * * *